United States Patent [19]
Gerendt

[11] Patent Number: 4,760,363
[45] Date of Patent: Jul. 26, 1988

[54] HIGH FREQUENCY SIGNAL SWITCHING SYSTEM

[75] Inventor: Siegfried Gerendt, Hildesheim, Fed. Rep. of Germany

[73] Assignee: Blaupunkt-Werke GmbH, Hildeshiem, Fed. Rep. of Germany

[21] Appl. No.: 36,255

[22] Filed: Apr. 9, 1987

[30] Foreign Application Priority Data

Apr. 16, 1986 [DE] Fed. Rep. of Germany ....... 3612732

[51] Int. Cl.$^4$ ...................... H03H 7/00; H03K 17/74
[52] U.S. Cl. ..................................... 333/262; 307/259
[58] Field of Search ..................... 333/103, 104, 81 R, 333/81 A, 262; 307/256, 259

[56] References Cited

U.S. PATENT DOCUMENTS 3,179,816  4/1965  Hall et al. ..................... 333/104 X
3,503,015  3/1970  Coraccio et al. ................. 333/104
4,668,882  5/1987  Matsuura ..................... 333/81 R X

*Primary Examiner*—Paul Gensler
*Attorney, Agent, or Firm*—Frishauf, Holtz, Goodman & Woodward

[57] ABSTRACT

A T-network with a capacitor in the shunt branch and similarly poled diodes in the series branches provides an electronic switch for the IF signals in a VHF receiver exhibiting 58 dB of attenuation in the block condition and negligible attenuation when the diodes are conducting. The resistance across the input of the IF amplifier and, if necessary, a resistance in the switching voltage path, determine the amount of current through the diodes when they are conducting under application of the switching voltage. Low pass filtering in the switching voltage leads and blocking capacitors in the signal connections of the switch restrict signal and switching voltages to their respective paths. Applying a positive potential to one switching terminal closes the switch and applying it to the other switching terminal opens it.

2 Claims, 1 Drawing Sheet

HIGH FREQUENCY SIGNAL SWITCHING SYSTEM

This invention concerns a switching system for selection between or among high frequency channels by a selector switch that minimizes pickup of signals from non-selected channels through stray capacitances.

A variety of circuits and devices are known for switching of high frequency signals. A diode is often provided in the signal path which can be put into the conducting or non-conducting state by the application of corresponding DC voltages serving as switch control voltages. The capacitance of the diode in its blocking condition, however, is often great enough to make the attenuation of the unwanted signal at higher frequencies quite insufficient for various applications. Efforts to overcome this difficulty by utilizing two or more diodes in series have failed to provide adequate value for attenuation in the blocking condition of the diodes.

A particularly high value for the attenuation in the blocking condition of an electronic switching element is required in VHF receivers having switchable selectivity, in which an intermediate frequency signal within the receiver is supplied over two different paths from the tuner portion of the receiver to an intermediate frequency amplifier. In such receivers one of the signal paths is equipped with a supplemental filter. With high frequency switches respectively provided in both paths, the intermediate frequency signal is controlled to proceed to the amplifier over one or the other of the paths. High attenuation in the blocked condition is desired for the switches, since otherwise in operation of the VHF receiver at high selectivity, thus at low band width, signal components outside of the narrow passband of the selected signal path reach the intermediate frequency amplifier from the unselected path of greater bandwidth and thereby spoil the selectivity characteristic of the receiver.

SUMMARY OF THE INVENTION

It is an object of the present invention to provide a switching means capable of providing a high degree of isolation between switch terminals in the open condition of the switch even at high frequencies and, in particular, to do so for semiconductor switching means for channel selection in a VHF receiver.

Briefly, a T-network is provided in the signal path to be controllably interrupted, this T-network having its series branches provided by diodes and its parallel branch provided by a capacitor. The invention has the advantage that a very high blocking attenuation is produced with simple semiconductor switching means.

For most requirements it is sufficient to use two diodes, one in each series branch of the T-network, although it is contemplated in accordance with the invention that more than one diode could be used in one series branch or that the T-network can be supplemented by one or more L-networks each composed of a series diode and a shunt capacitor.

It is preferred to have the series diodes conduct in the same series direction. The invention also comprehends arrangements for application of a d.c. switching voltage to the diodes with filtering for blocking high frequency signals from the control circuits, and the like, arrangement which will be better understood in connection with an illustrated description that follows.

BRIEF DESCRIPTION OF THE DRAWING

The invention is, accordingly, further described by way of illustrative example with reference to the annexed drawing in which.

DESCRIPTION OF THE ILLUSTRATED EMBODIMENT

Figure 1:
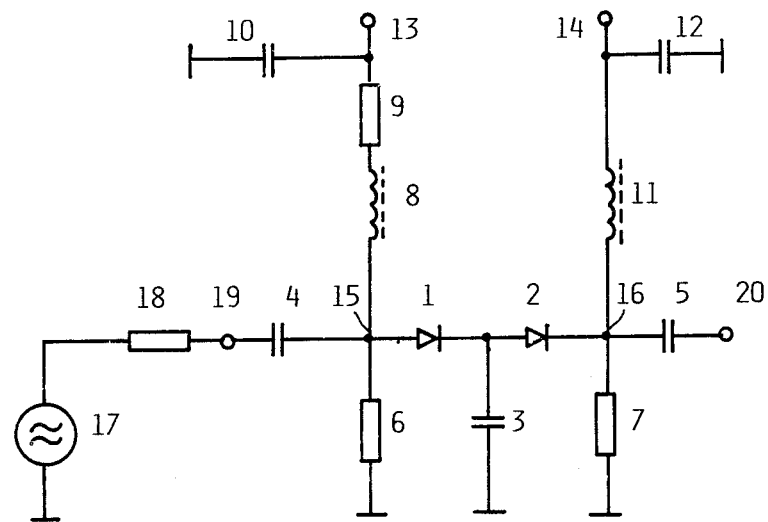
FIG. 1 is a circuit diagram of a switching system according to the invention.

In the respective figures of the drawing, components which are the same are identified with the same reference numerals.

As shown in FIG. 1, the diodes 1 and 2 and the capacitor 3 form a T network which lies in the path of signals proceeding from a terminal 19 to a terminal 20. These terminals are to be switched. When the signal path is to be conducting, a positive switching voltage is supplied at 13 which produces a current through the resistance 9, the inductor 8, the two diodes 1 and 2 and the resistance 7. The values of the resistances 7 and 9 are so chosen that a sufficient current flows to bring the diodes 1 and 2 to sufficiently low resistances to have a negligible effect on the passage of high frequency signals through the diodes.

For blocking the signal path in FIG. 1 (i.e. opening the switch) a positive switching voltage is applied at 14 while no voltage is applied at 13. The input 15 of the T-network is thereby grounded over the resistance 6. The diodes 1 and 2 accordingly receive a blocking voltage, so that they are non-conducting for the high frequency signal. In this condition of the circuit, the capacitor 3 forms a voltage divider with the blocking capacitance of the diode 1. The capacitance of the capacitor 3 is chosen to be substantially greater than the blocking capacitance of the diode 1, so that high attenuation is produced for the signals that are capable of passing through the blocking capacitance of the diode. When the diodes 1 and 2 are conducting, however, the capacitive conductance value of the capacitor 3 for the frequencies coming into consideration is small compared to the conductance of the diodes 1 and 2 and of the resistor 7, so that the slight attenuation of the signals switched through the circuit in the higher frequency region is negligible or at any rate acceptable.

The inductance 8, the resistance 9 and the capacitor 10 and likewise the inductance 11 and the capacitor 12 form low pass filters which prevent the high frequencies from reaching the conductors (not shown) for applying these switching voltages for otherwise producing malfunctions.

A signal source 17 and an impedance matching series resistor 18 are shown to make more clear how the signal is applied to the switching circuit of FIG. 1. The switched high frequency voltage appears at the output 20 when the switch is put into its conducting condition. Coupling capacitors 4 and 5, which serve to block the switching voltages from the signal circuits to be connected, are respectively interposed between the input 19 and the switching point 15 and between the switching point 16 and the output 20.

Figure 2:
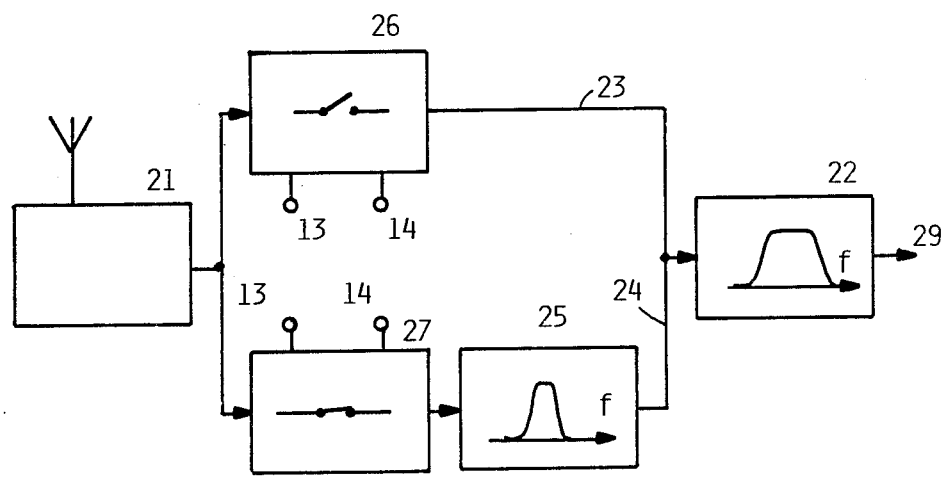
FIG. 2 is a circuit block diagram of circuits in a VHF receiver comprising two switching systems according to FIG. 1.

The manner of use of the circuit of FIG. 1 is illustrated in FIG. 2 which illustrates a VHF tuner 21 and intermediate amplifier 22, which is of a predetermined pass selectivity illustrated symbolically in the drawing in that circuit block. Connected between the tuner 21 and the intermediate frequency amplifier 22 are two parallel signals paths 23 and 24. Additional circuits of a well-known kind, which are not shown, are provided beyond the output 29 of the intermediate amplifier 22 and provide the further stages of the VHF receiver.

The signal path 24 is the more selective of the two paths and includes supplementary filtering means symbolized by the relatively narrow band-pass filter 25. Either one of the signal paths 23 and 24 can be switched in or out by means of the switches 26 and 27, which are constituted in the manner of FIG. 1 as is indicated by the provision of terminals 13 and 14 corresponding to the similar terminals in FIG. 1 for the application of the switching voltages by circuits again not shown. As the result of the very high attenuation of the open switch provided in accordance with the invention, the result is that in operation of the circuit of FIG. 2 with the supplementary selectivity provided in the path 24 and with the switch 26 open (blocked) and the switch 27 closed (conducting) no undesired residual broadband signals are allowed to pass through the switch 26 and thereby to spoil the selectivity characteristics of the path 24 and therefore of the receiver.

In a practical embodiment according to the invention which has confirmed the advantages of the invention, thre capacitance of the capacitor 3 of FIG. 1 was chosen to be 18 pF and diodes commercially available as type BA 281 diodes were utilized. The attenuation in the blocked condition of the switch that was typically obtainable with such a T-network, was 58 dB.

Although the invention has been described with reference to a particular illustrative example, it will be understood that variations and modifications are possible within the inventive concept. For example, it is not necessary to switch the circuit of FIG. 1 by applying a positive voltage either to terminal 13 or terminal 14 while leaving the other terminals without applied voltage. It would be possible to switch the circuit by applying a positive voltage to one terminal and a negative voltage to the other and to reverse the connections to negative and positive voltage in order to throw the switch. In such a case, the resistors 6 and 7 could have values desired for signal transmission without regard to influence on the forward current through the diodes in the case of resistor 7 or the effective grounding of the input 15 of the T-network in the case of the resistor 6. The resistor 9 would determine the current through the diodes when they are conducting and the application of a negative voltage to the terminal 13 would assure the blocking of both diodes while allowing a high resistance to be used for the resistor 6. Of course, the provision of negative and positive switching voltages to be used simultaneously would be an additional complication and expense, but there might be applications in which such switch control would be desirable.

I claim:

1. Circuit for switching high-frequency signals having a signal input connection (19), a signal output connection (20), reference voltage connections and first and second switch control voltage connections (13, 14) and further comprising:

a T-network having a shunt branch composed of a capacitor (3) and series branches each comprising a diode, a common connection of said series branches being connected to said shunt branch, said capacitor (3) constituting said shunt branch being connected between said common connection and a said reference voltage connection, said diodes of said series branches being similarly poled in cascade in series between said signal input and signal output connections;

first and second blocking capacitors (4, 5) respectively connected to said diodes and respectively interposed between said diodes and said signal input and output connections, for respectively connecting said signal input and output connections to said network and for blocking switch control voltage from reaching high-frequency transmission circuits, a path composed only of a fixed resitance (6, 7) being provided from each connection of a said blocking capacitor (4, 5) with a said diode (1, 2) to a said reference voltage connection, said shunt branch capacitor (3) having a capacitance which is high enough compared to the capacitance of said diodes for substantially shunting said signals when said diodes (1,2) are non-conducting and small enough relative to the capacitance of said blocking capacitors (4, 5) for providing a negligible shunting down effect when said diodes are conducting;

and first and second high-frequency choke means (8, 11) respectively interposed between said diodes and said switch control connections for connecting switch control voltages to said network and blocking high frequency signal voltage from reaching said switch control connections and first and second by-pass capacitors (10, 12) connected between a said reference voltage connection and, respectively, said first and second switch control voltage connections (13, 14) for by-passing high frequency voltages, said choke means, by-pass capacitors and any other component (9) in series with said choke means between said network and said by-pass capacitors respectively having impedances which are fixed regardless of application or non-application of switch control voltage.

2. Circuit according to claim 1, wherein said signal input connection is connected to said common connection of said network through said first blocking capacitor (4) and through a diode (1) of said network having a its cathode connected to said common connection and thereby to said capacitor (3) consituting said shunt branch of said network.

* * * * *